United States Patent
Chae

(10) Patent No.: US 8,244,968 B2
(45) Date of Patent: Aug. 14, 2012

(54) FLASH MEMORY DEVICE CAPABLE OF IMPROVING READ PERFORMANCE

(75) Inventor: Dong-Hyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/098,568

(22) Filed: May 2, 2011

(65) Prior Publication Data

US 2011/0208903 A1   Aug. 25, 2011

Related U.S. Application Data

(63) Continuation of application No. 12/044,179, filed on Mar. 7, 2008, now abandoned.

(30) Foreign Application Priority Data

Mar. 19, 2007   (KR) .................. 10-2007-0026658

(51) Int. Cl.
*G06F 12/00* (2006.01)

(52) U.S. Cl. ............................................. 711/103

(58) Field of Classification Search .................. None
See application file for complete search history.

(56) References Cited

U.S. PATENT DOCUMENTS

| | | | | |
|---|---|---|---|---|
| 6,728,798 | B1 * | 4/2004 | Roohparvar | 710/35 |
| 7,096,283 | B2 * | 8/2006 | Roohparvar | 710/14 |
| 7,123,521 | B1 | 10/2006 | Louie et al. | |
| 2005/0228962 | A1 | 10/2005 | Takase et al. | |
| 2005/0286309 | A1 * | 12/2005 | Kang et al. | 365/185.23 |
| 2006/0233010 | A1 | 10/2006 | Li | |

FOREIGN PATENT DOCUMENTS

| | | |
|---|---|---|
| KR | 1019990084702 | 12/1999 |
| KR | 1020030088595 A | 11/2003 |
| KR | 1020050064666 A | 6/2005 |
| KR | 1020050096445 A | 10/2005 |
| KR | 1020050112988 A | 12/2005 |
| KR | 1020060052142 A | 5/2006 |
| KR | 1020060060386 A | 6/2006 |
| KR | 1020060060387 A | 6/2006 |

* cited by examiner

*Primary Examiner* — Brian Peugh
(74) *Attorney, Agent, or Firm* — Volentine & Whitt, PLLC

(57) ABSTRACT

A flash memory device, related system ad method are disclosed. The memory device includes a memory cell array a page buffer receiving read data, wherein the page buffer includes a main register transferring read data to a cache register during an read operation, and a control logic block controlling operation of the page buffer during the read operation, such that initialization of the main register continuously extends beyond a time period during which read data is transferred from the main register to the cache register.

17 Claims, 6 Drawing Sheets

FLASH MEMORY DEVICE CAPABLE OF IMPROVING READ PERFORMANCE

CROSS-REFERENCE TO RELATED APPLICATIONS

This U.S. non-provisional patent application is a continuation of U.S. patent application Ser. No. 12/044,179 filed on Mar. 7, 2008, which claims priority under 35 U.S.C. §119 to Korean Patent Application No. 10-2007-0026658 filed on Mar. 19, 2007, the collective subject matter of which is hereby incorporated by reference.

BACKGROUND OF THE INVENTION

The present invention relates to semiconductor memory devices. More particularly, the invention relates to flash memory devices executing cache read functions.

Driven by ever-growing demands for higher performance contemporary memory systems including flash memory devices have incorporated a cache read functionality. During a cache read operation, previous read data stored in a cache register is output to an external circuit while current read data is read from memory through a main register. An exemplary cache read operation will be described with reference to FIG. 1.

Referring to FIG. 1, a read command, a corresponding read data address, and a read operation start indication are provided to a memory system incorporating flash memory (hereafter, "a flash memory system") according to a predetermined timing sequence. In the constituent flash memory device, after receiving the read start command, a ready/busy signal R/nB transitions from logically "high" to a logically "low" state (i.e., "goes low"). Operation of the main register is initiated after the ready/busy signal R/nB goes low during a first time period P1. The read data identified by the address is read from memory by operation of the main register during a second time period P2. Then, current read data stored in the main register are transferred to a cache register during a third time period P3. After the current read data is transferred to the cache register from the main register, the ready/busy signal R/nB goes high.

In response to the ready/busy signal R/nB going high, a cache read command is provided to the flash memory device by an external device (e.g., a memory controller in the flash memory system). Upon receiving the cache read command, the ready/busy signal R/nB in the flash memory device goes low during a fourth time period P4 and then returns high. During the fourth time period P4 defined by the transition of the ready/busy signal R/nB, current read data is transferred to the cache register from the main register. Following this read data transfer, the ready/busy signal R/nB goes high. Then, operation of the main register is initiated after the ready/busy signal R/nB goes high beginning a fifth time period P5. Thus, read data is output from memory through the main register and read data stored in the cache register is output to the external device during the fifth and sixth time periods P5 and P6.

According to this sequence of steps in the cache read operation, previous read data is output to the external circuit from the cache register when the main register is initiated during the fifth time period P5. However, noise commonly associated with the provision of power voltages within the flash memory system occur during the output of the previous read data to the external circuit from the cache register. In addition, noise associated with the initiation of main register operation is also apparent during this time frame. Thus, the simultaneous generation of noise by the initialization of main register operation and output of previous read data from the cache register, may generally degrade channel conditions and cause data errors to arise in the read data being transferred.

SUMMARY OF THE INVENTION

In one embodiment, the invention provides a flash memory device comprising; a memory cell array configured to store N-bit read data, where N is a positive integer, a page buffer circuit comprising a page buffer configured to receive read data from the memory cell array during a read operation, wherein the page buffer comprises a main register transferring read data to a cache register during the read operation, and a control logic block configured to control operation of the page buffer during the read operation such that initialization of the main register continuously extends beyond a time period during which read data is transferred from the main register to the cache register.

In another embodiment, the invention provides a method of performing a read operation in a flash memory device comprising a memory cell array; and a page buffer circuit comprising a page buffer, wherein the page buffer comprises a main register and a cache register, the method comprising; initiating operation of the main register, after transferring read data to the cache register, deactivating the main register, receiving a cache read command after deactivation of the main register, reactivating the main register in response to receiving the cache read command, transferring read data from the main register to the cache register upon reactivation of the main register, and maintaining activation of the main register during a delay period following complete transfer of the read data from the main register to the cache register.

In another embodiment, the invention provides a memory system comprising; a memory controller configured to control a flash memory device in response to a read command and a cache read command provide by an external circuit. The flash memory device comprises; a memory cell array configured to store N-bit read data, where N is a positive integer, a page buffer circuit comprising a page buffer configured to receive read data from the memory cell array during a read operation, wherein the page buffer comprises a main register transferring read data to a cache register during the read operation, and a control logic block configured to control operation of the page buffer during the read operation such that initialization of the main register continuously extends beyond a time period during which read data is transferred from the main register to the cache register.

DESCRIPTION OF EMBODIMENTS

Embodiments of the invention will now be described with reference to the accompanying drawings. The invention may, however, be variously embodied and should not be construed as being limited to only the illustrated embodiments. Rather, the embodiments are provided as teaching examples.

Figure 1:
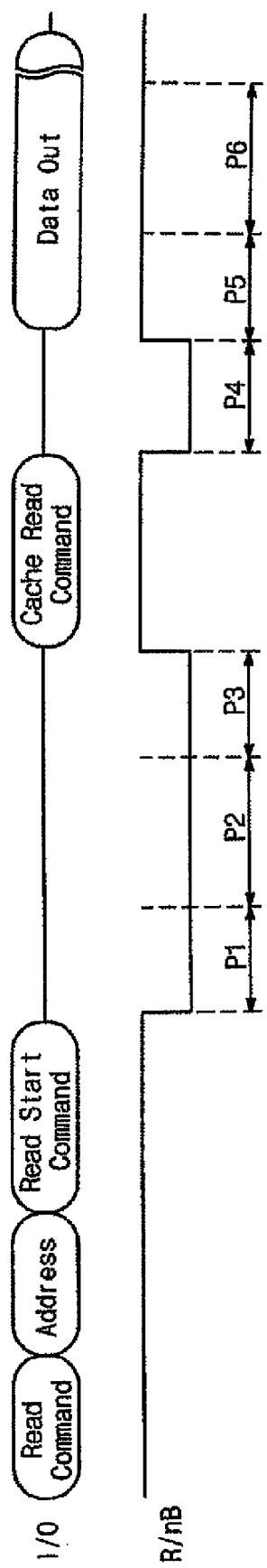
FIG. 1 is a timing diagram illustrating a conventional cache read operation.
Figure 2:
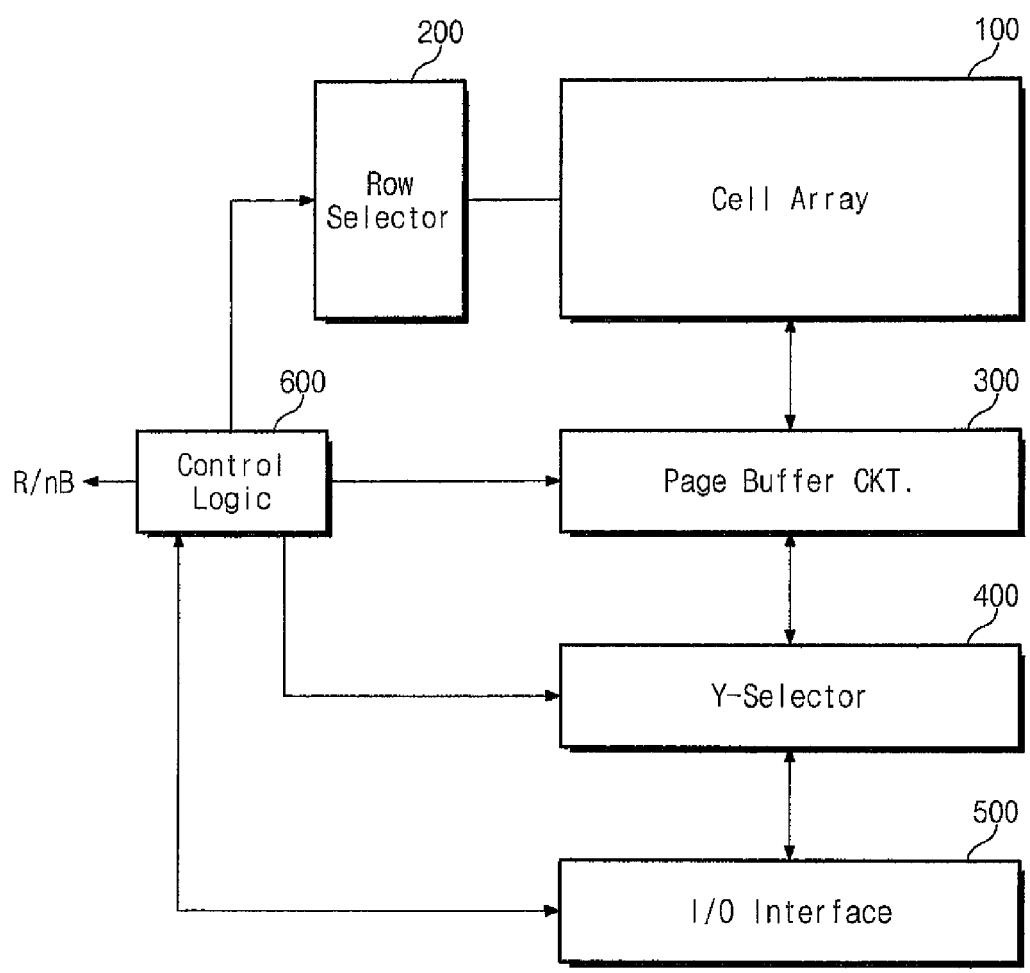
FIG. 2 is a block diagram of a flash memory device operating within a memory system according to an embodiment of the invention.

FIG. 2 is a block diagram of a flash memory device adapted for use within a memory system according to an embodiment of the invention. In the illustrated embodiment, a NAND flash memory device is assumed for purposes of description, but those skilled in the art will understand that this is merely one example of a class of flash memory devices that might be used within embodiments of the invention.

Referring to FIG. 2, the flash memory device comprises a memory cell array 100 of conventional arrangement storing N-bit data, where N is a positive integer. A row selector 200 operates under the control of control logic block 600 to select and drive one or more rows within memory cell array 100. A page buffer circuit 300 is configured to read data from memory cell array 100 during a reading operation and drive columns during with one or more defined voltages during a programming operation. As is conventional, page buffer circuit 300 may be composed of multiple page buffers (PB) arranged in relation to the columns within memory cell array 100.

Figure 3:
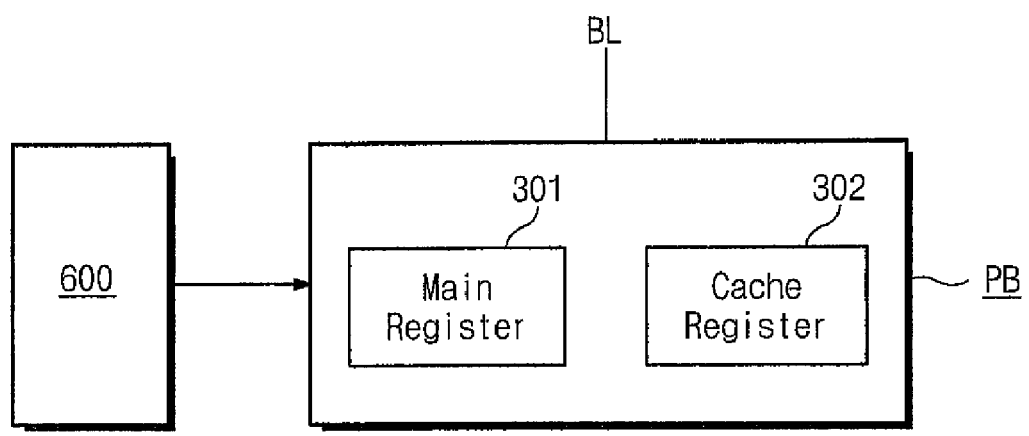
FIG. 3 is a block diagram further illustrating the page buffer shown in FIG. 2.

Each page buffer PB within page buffer circuit 300, (see, e.g., FIG. 3), may include a main register 301 and a cache register 302. According to this illustrated embodiment, during a cache read operation, main register 301 is used to read data from memory cell array 100 and cache register 302 is used to store data transferred from main register 301. In various embodiments of the invention, a page buffer (PB) may be variously configured according to the cache read operation intended. Exemplary page buffer structure capable of implementing a cache read function are disclosed, for example, in U.S. Pat. Nos. 7,180,783; 7,042,770; and 6,996,014, the collective subject matter of which is hereby incorporated by reference.

Returning to FIG. 2, a column selector 400 also operates under the control of control logic block 600 to select a page buffer within page buffer circuit 300 according to a defined data unit size (e.g., byte or word). During the reading operation, read data received in individual page buffer(s) selected by column selector 400 are output to an external circuit (e.g., a memory controller) by way of input/output (I/O) interface 500 also controlled by control logic block 600.

During a programming operation, write data applied through I/O interface 500 by control logic block 600 is loaded into individual page buffer(s) selected by column selector 400. Control logic block 600 operates to control overall functions of the flash memory device, and may be implemented using well understood design principals. In particularly relevant part to the illustrated embodiments, control logic block 600 functions to control the activation/deactivation of the ready/busy signal R/nB such that initialization of one or more main register(s) 301 does not coincide with the output of read data from one or more cache register(s) 302. In other words, control logic block 600 deactivates the ready/busy signal R/nB following initialization of main register(s) 301. After deactivating the ready/busy signal R/nB, read data is output to the external circuit from cache register(s) 302, as will be described in some additional detail hereafter.

Figure 4:
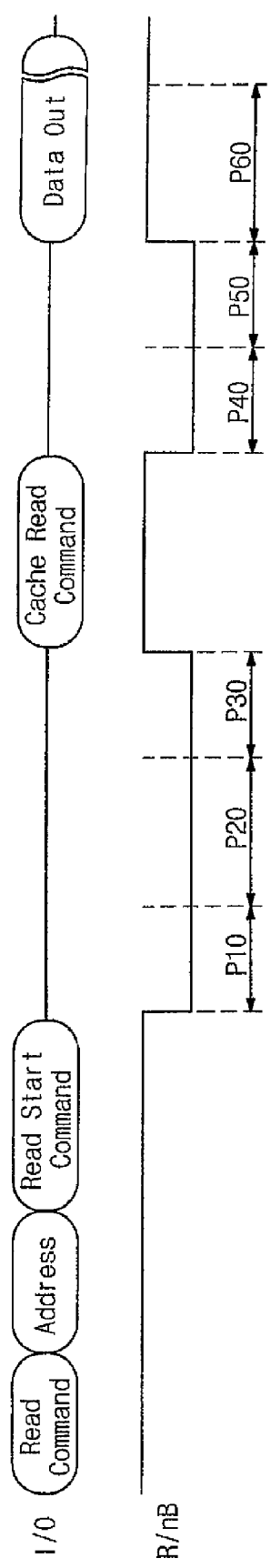
FIG. 4 is a timing diagram illustrating a cache read operation for a flash memory device within a memory system according to an embodiment of the invention.
Figure 5:
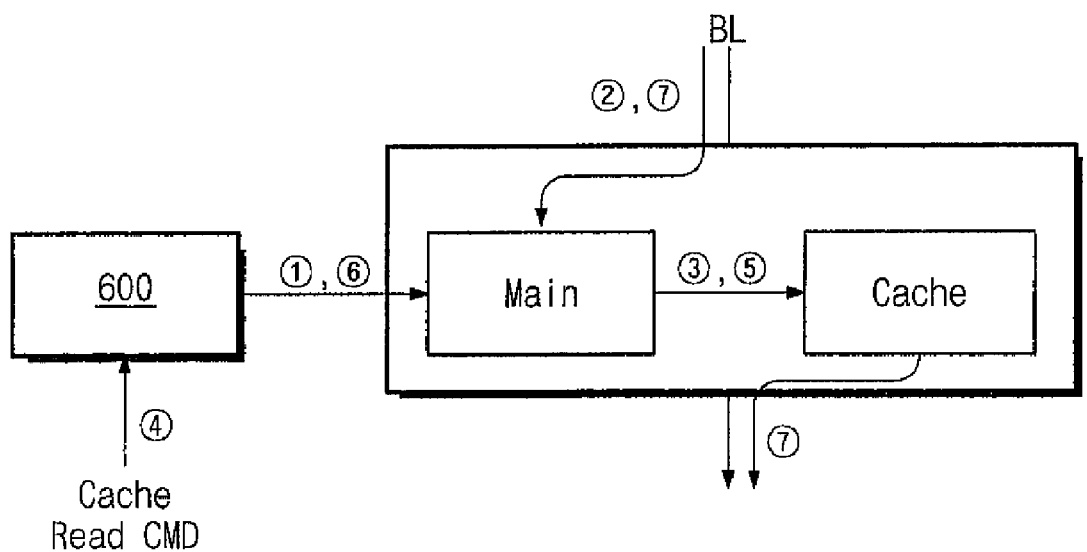
FIG. 5 is a conceptual diagram further illustrating an exemplary flow of read data during a cache read operation according to an embodiment of the invention.

FIG. 4 is a timing diagram showing a cache read operation performed by a flash memory device within a memory system according to an embodiment of the invention. FIG. 5 is a related conceptual diagram showing an exemplary flow of data during the cache read operation. For convenience of description only a single page buffer (PB) operation will be described with an understanding that cache read operations enabled by embodiments of the invention may involve more than one page buffer.

First, as shown in FIG. 4, a read command, a corresponding address, and a read start indication are provided to a flash memory device designed and operated in accordance with an embodiment of the invention. Upon receiving the read start indication, control logic block 600 activates (e.g., causes a high to low transition of) the ready/busy signal R/nB to begin a first time period P10. During the first time period P10, control logic block 600 initiates operation of main register 301 using the ready/busy signal R/nB ($1^{st}$ step indicated in FIG. 5 by the circled number 1). During a following second period P20, the read data identified by the address is read from a memory cell array 100 through main register 301 under the control of control logic block 600 ($2^{nd}$ step in FIG. 5). Then, during a third period P30, read data is transferred to cache register 302 from main register 301 by control logic block 600 ($3^{rd}$ step in FIG. 5). After transferring the read data to cache register 302, control logic block 600 deactivates the ready/busy signal R/nB.

In response to the deactivation of the ready/busy signal R/nB, a cache read command is applied to the flash memory device from the external circuit ($4^{th}$ step in FIG. 5). After application of the cache read command, control logic block 600 reactivates the ready/busy signal R/nB.

The reactivation of the ready/busy signal R/nB begins a fourth period P40 and read data is transferred to cache register 302 from main register 301 by control logic block 600 ($5^{th}$ step in FIG. 5). Although the transfer of read data to cache register 302 from main register 301 is complete, as shown in FIG. 4, the ready/busy signal R/nB is maintained in an activated state for a delay period (i.e., a fifth time period P50) beyond the completion of read data transfer cycle, and main register 301 remains initiated ($6^{th}$ step in FIG. 5). Only after the delay period is complete will control logic block 600 deactivate the ready/busy signal R/nB. In response to the deactivation of the ready/busy signal R/nB, read data is output to the external circuit from cache register 302 ($7^{th}$ step in FIG. 5) during a sixth time period P60 and read data is provided from memory cell array 100 via main register 301 ($7^{th}$ step in FIG. 5).

As can be seen from the above description, the initialization period for main register 301 does not overlap with the output of read data from cache register 302. In other words, noise generated by the initialization of main register 301 will be non-coincident with noise generated by the output of read data from cache register 302. Thus, it is far less likely that channel transmission characteristics will be degraded to the point where data errors occur.

As a result of these improved data transfer properties, a flash memory devices and related memory system incorporating a nonvolatile memory according to an embodiment of the invention, are very well suited to mobile electronic devise such as cellular phones, personal digital assistants (PDA), digital cameras, portable gaming consoles, digital versatile disks (DVDs), routers, global positioning systems (GPS), MP3 players, HD TVs, flash storage devices, etc.

Figure 6:
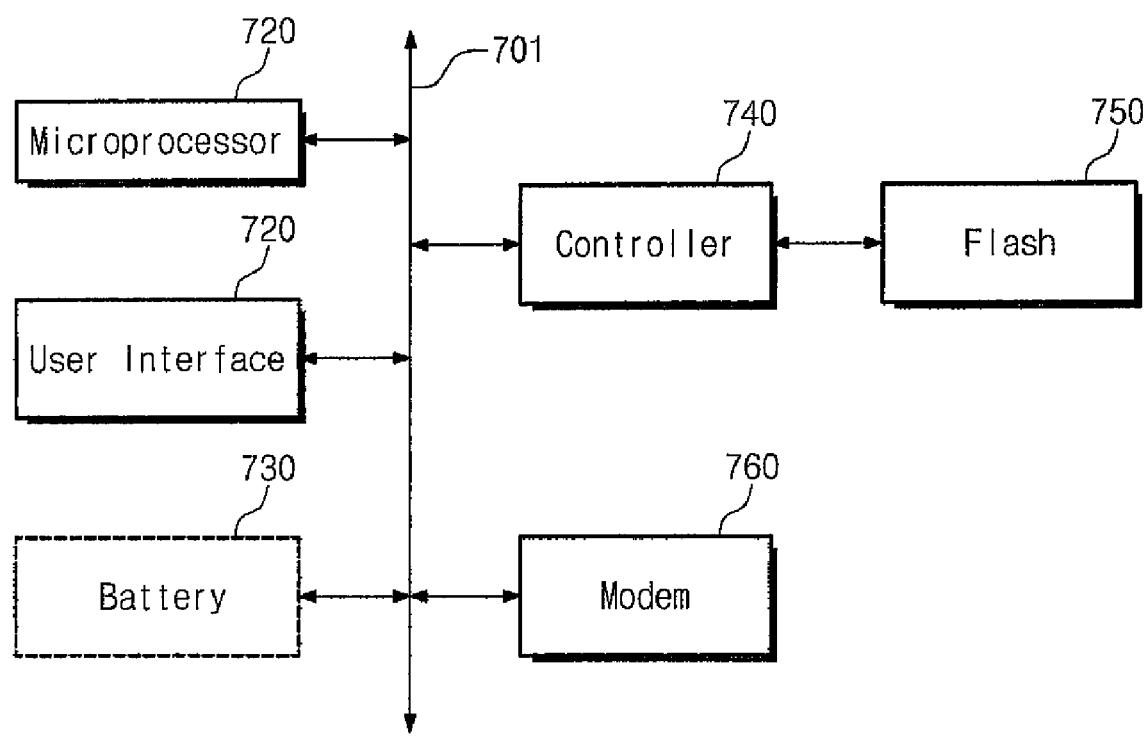
FIG. 6 is a block diagram of a general computational system incorporating a flash memory system according to an embodiment of the invention.

FIG. 6 is a general block diagram of a computational system susceptible to the incorporation of a flash memory device or a flash memory system according to an embodiment of the invention. The computing system comprises a microprocessor 710, a user interface 720, a modem 760 such as a baseband chipset, a memory controller 740, and the flash memory device 750, all of which are electrically connected to a bus 701. Flash memory device 750 may be configured as described above in relation to FIG. 2.

In flash memory device 750, N-bit data, where N is a positive integer processed or to be processed by microprocessor 710, is stored by the operative means of memory controller 740. If the computational system shown in FIG. 6 is a mobile apparatus, it will further comprise a battery 730 supplying power. Although not shown in FIG. 6, the computational system may further comprise an application chipset, a camera image processor (e.g., CMOS image sensor; CIS), a mobile DRAM, etc. Further, the flash memory device and/or associated memory controller may be configured on a memory card with the flash memory system.

As described above, since the initialization period for a main register does not overlap with the output of read data from a cache register, data communication reliability and performance is improved for data read operations performed by a flash memory device according to an embodiment of the invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents.

What is claimed is:

1. A method of operating a non-volatile memory device comprising a memory cell array and a page buffer, the page buffer having a main register and a cache register, the method comprising:
    transferring read data to the cache register from the main register;
    initializing the main register; and
    outputting the read data to an external device from the cache register after completion of the initialization of the main register.

2. The method as set forth in claim 1, wherein the transferring read data to the cache register from the main register is performed in response to a cache read command supplied from the external device.

3. The method as set forth in claim 1, wherein during a period of the transferring and the initializing, a status signal of the non-volatile memory device is set to busy.

4. The method as set forth in claim 3, wherein during a period of the outputting, a status signal of the non-volatile memory device is set to ready.

5. The method as set forth in claim 3, wherein the status signal is supplied as ready/busy signal R/nB.

6. The method as set forth in claim 1, further comprising:
    reading the read data from the memory cell array through the main register before transferring the read data from the main register to the cache register.

7. The method as set forth in claim 1, further comprising:
    reading another data from the memory cell array through the main register while the read data are output to the external device from the cache register.

8. A method of operating a non-volatile memory device having a memory cell array, the method comprising:
    reading data from the memory cell array to a main register in a page buffer in response to a read start command;
    transferring the read data to the cache register from the main register in response to a cache read command;
    initializing the main register;
    setting a ready/busy signal R/nB to ready state after completion of the initialization of the main register;
    outputting the read data to an external device from the cache register while the ready/busy signal R/nB is set to ready state.

9. The method as set forth in claim 8, wherein the ready/busy signal R/nB is set to a busy state during a period of the transferring and the initializing.

10. The method as set forth in claim 9, further comprising:
    receiving the cache read command supplied from the external device while a ready/busy signal R/nB is set to ready state.

11. The method as set forth in claim 10, wherein the ready state of the ready/busy signal R/nB corresponds to logic 'high'.

12. A memory system comprising:
    a non-volatile memory device comprising a page buffer which includes a main register and a cache register, the main register transferring read data to a cache register during a read operation; and
    a memory controller supplying a cache read command to the non-volatile memory device and receiving the read data from the cache register of the non-volatile memory device,
    wherein an initialization period for the main register is not overlapped with the receiving of the read data from the cache register by the memory controller.

13. The memory systems of claim 12, wherein the non-volatile memory device comprises:
    a memory cell array having a plurality of memory cells arranged in rows and columns; and
    a control logic configured to control operation of the page buffer during the read operation such that outputting the read data from the cache register is performed after completion of the initialization of the main register.

14. The memory system of claim 13, wherein the control logic set a ready/busy signal R/nB to busy during the initialization period for the main register.

15. The memory system of claim 13, wherein the control logic set a ready/busy signal R/nB to ready when the initialization of the main register is completed.

16. The memory system of claim 15, wherein the control logic control the cache register to output the read data to the memory controller concurrently with transition of the a ready/busy signal R/nB from busy to ready.

17. The memory system of claim 13, wherein the control logic is further configured to control the page buffer to receive another read data from the memory cell array through the main register in a time period during which read data is output from the cache register to the memory controller.

* * * * *